(12) United States Patent
Kawasaki et al.

(10) Patent No.: US 8,476,657 B2
(45) Date of Patent: Jul. 2, 2013

(54) LIGHT-EMITTING DEVICE

(75) Inventors: Osamu Kawasaki, Osaka (JP); Toshio Hata, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 434 days.

(21) Appl. No.: 12/625,993

(22) Filed: Nov. 25, 2009

(65) Prior Publication Data

US 2010/0133571 A1 Jun. 3, 2010

(30) Foreign Application Priority Data

Nov. 28, 2008 (JP) ................................. 2008-304733

(51) Int. Cl.
*H01L 33/00* (2010.01)
*H01L 21/00* (2006.01)

(52) U.S. Cl.
USPC ............... 257/98; 257/99; 257/100; 257/81; 438/26; 438/29; 438/31

(58) Field of Classification Search
USPC .................. 438/26, 29, 31; 257/98, 99, 100
See application file for complete search history.

(56) References Cited

U.S. PATENT DOCUMENTS

| 6,054,716 | A | 4/2000 | Sonobe et al. | |
|---|---|---|---|---|
| 2004/0104391 | A1* | 6/2004 | Maeda et al. | 257/79 |
| 2005/0067628 | A1 | 3/2005 | Kuwabara et al. | |
| 2005/0093005 | A1* | 5/2005 | Ruhnau et al. | 257/79 |
| 2006/0054901 | A1* | 3/2006 | Shoji et al. | 257/80 |
| 2008/0054287 | A1 | 3/2008 | Oshio et al. | |

FOREIGN PATENT DOCUMENTS

| JP | 2005-026401 A | 1/2005 |
|---|---|---|
| JP | 2005-109172 A | 4/2005 |
| JP | 2006-093697 A | 4/2006 |
| JP | 2006-332618 A | 12/2006 |
| JP | 2007-280983 A | 10/2007 |
| JP | 2008-060344 A | 3/2008 |
| JP | 2008-084943 | 4/2008 |

* cited by examiner

*Primary Examiner* — Fernando L Toledo
*Assistant Examiner* — Karen Kusumakar
(74) *Attorney, Agent, or Firm* — Nixon & Vanderhye, P.C.

(57) ABSTRACT

To provide a light emitting device easy to produce and extracting light to its outside with high efficiency, the light-emitting device 70 of the present invention includes an insulating base 10; a light-emitting element 1 mounted on a side of the base 10; and a protection element 2 mounted on the side and protecting the light-emitting element 1. The element 2 is covered with a light-reflecting filler-containing resin 5, which is prepared by causing a flexible silicone resin to contain, before being cured, light-reflecting or light-scattering fillers 5a having a particle diameter larger than the wavelength of light emitted by the element 1. This causes light emitted from the element 1 to be reflected by the resin 5, instead of being absorbed by the element 2, so that such light is released to the outside of the light-emitting device 70. This allows the device 70 to extract light to the outside with high efficiency, and also allows for easy formation of the resin 5 having a desired pattern and position.

12 Claims, 8 Drawing Sheets

PRIOR ART

FIG. 10

PRIOR ART

LIGHT-EMITTING DEVICE

This Nonprovisional application claims priority under 35 U.S.C. §119(a) on Patent Application No. 2008-304733 filed in Japan on Nov. 28, 2008, the entire contents of which are hereby incorporated by reference.

TECHNICAL FIELD

The technology disclosed herein relates to a light-emitting device for use, e.g., in an illumination instrument, a display device, a backlight device for a mobile telephone, an auxiliary light source for illumination of motion images, and other common household light sources.

BACKGROUND ART

A side light-emitting device or a surface mount light-emitting device including a light-emitting element formed, e.g., with a semiconductor is compact and power-efficient, and emits light having a vivid color.

Such side light-emitting devices, surface mount light-emitting devices and the like encompass a type of light-emitting device that includes a protection element formed, e.g., with a Zener diode, so as to improve its tolerance to (i) a reverse voltage and (ii) a serge voltage caused, e.g., by static electricity, both applied to its light-emitting element. The protection element is electrically connected to the light-emitting element within the light-emitting device.

Figure 9:
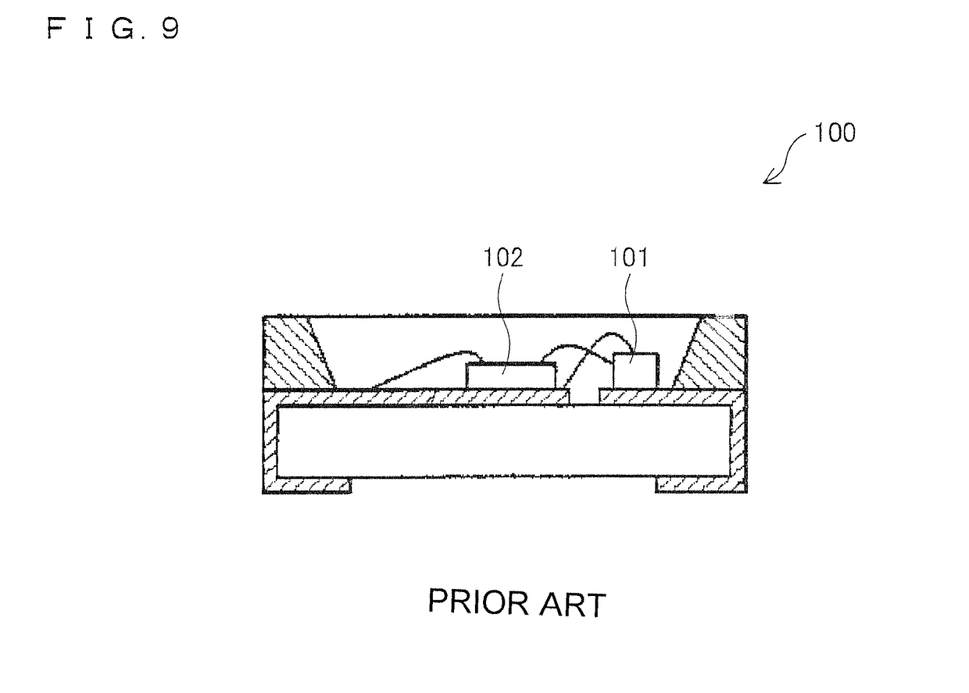
FIG. 9 is a cross-sectional view schematically illustrating a conventional surface mount light-emitting device.

FIG. 9 is a cross-sectional view illustrating a light-emitting device including a conventional protection element (see Patent Literature 1). The light-emitting device 100 includes: a light-emitting element 102; and a protection element 101 formed with a Zener diode. The protection element 101 is electrically connected to the light-emitting element 102 in parallel. A reverse voltage applied to the light-emitting element 102 causes a current to flow through the protection element 101. This allows for protection of the light-emitting element 102. Further, application of an overvoltage, higher than a certain voltage, to the light-emitting element 102 causes a voltage applied to the protection element 101 to exceed the Zener voltage value. This in turn causes a current to flow through the protection element 101 and thus protects the light-emitting element 102.

However, the above arrangement poses the following problem: The inclusion of the protection element 101 in the light-emitting device 100 causes light from the light-emitting element 102 to be absorbed or blocked by the protection element 101. This significantly reduces an amount of light emitted from the light-emitting device 100 to the outside.

To solve this problem, Patent Literature 1 discloses an arrangement in which (i) a recess is formed below the protection element 101 illustrated in FIG. 9, and the protection element 101 is mounted in the recess so as to be positioned lower than the light-emitting element 102, or (ii) a spacer is provided below the light-emitting element 102 so that the light-emitting element 102 is positioned higher than the protection element 101. This arrangement reduces an influence of the protection element 101 absorbing or blocking light.

Figure 10:
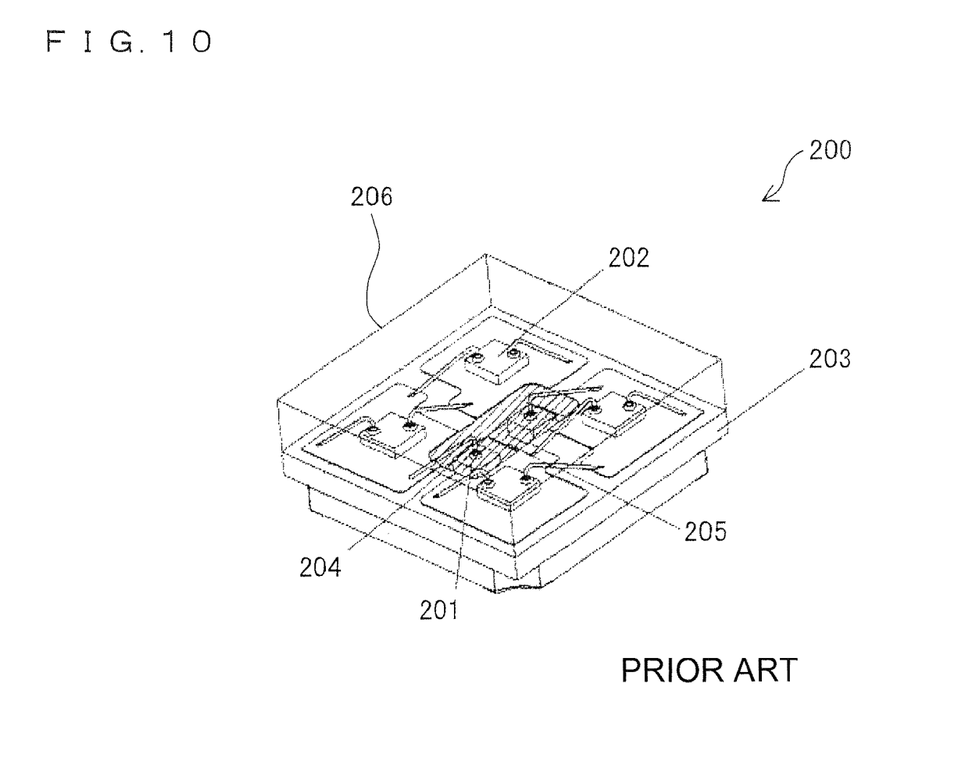
FIG. 10 is a perspective view schematically illustrating a conventional surface mount light-emitting device.

FIG. 10 is a perspective view illustrating a light-emitting device including a conventional protection element (see Patent Literature 2). The light-emitting device 200 includes an insulating substrate 203; light-emitting elements 202 mounted on an upper surface of the insulating substrate 203; and protection elements 201. The insulating substrate 203 is depressed, along a direction from its upper surface toward its bottom surface, in a region of its upper surface, the region having no light-emitting element 202 provided therein, whereby a concave opening section 204 is formed. The protection elements 201 are contained in the concave opening section 204. In addition, the concave opening section 204 is sealed with a light-reflecting member 205 capable of reflecting light from the light-emitting elements 202. Further, the light-reflecting member 205 and the light-emitting elements 202 are covered with a light-transmitting member 206 capable of transmitting light from the light-emitting elements 202.

The light-reflecting member 205 reflects light from the light-emitting elements 202 toward an upper surface of the light-emitting device 200. This prevents such light from being absorbed or blocked by the protection elements 201.

CITATION LIST

Patent Literature 1

Japanese Patent Application Publication, Tokukaihei, No. 11-54804 A (Publication Date: Feb. 26, 1999)

Patent Literature 2

Japanese Patent Application Publication, Tokukai, No. 2008-84943 A (Publication Date: Apr. 10, 2008)

Non Patent Literature 1

SANYO TRADING CO., LTD. "The Consultation room of Rubber and Elastomer", [online] SANYO TRADING CO., LTD. [retrieved on Oct. 10, 2008,] Internet <URL:http://www.gomuelastomer.net/fillerdata.htm>

SUMMARY

Technical Problem

The above conventional arrangements unfortunately have the following problems.

According to the arrangement of the light-emitting device 100 of Patent Literature 1 illustrated in FIG. 9, the protection element 101 is positioned lower than the light-emitting element 102. However, even with this arrangement, if the protection element 101 has a light-absorbing body color, light emitted from the light-emitting element 102 is partly absorbed by the protection element 101. This reduces the amount of light emitted to the outside of the light-emitting device 100.

According to the arrangement of the light-emitting device 200 of Patent Literature 2 illustrated in FIG. 10, the insulating substrate 203 has a concave opening section 204 in which the protection elements 201 are placed, so as to prevent the protection elements 201 from blocking light from the light-emitting elements 202. This problematically leads to complexity in a wiring pattern and a shape of the electrodes on the insulating substrate 203, thus complicating a process of producing the light-emitting device 200. This in turn impedes inexpensive production of the light-emitting device 200. Furthermore, the light-reflecting member 205 covering the protection elements 201 has a light-reflecting surface parallel to the insulating substrate 203. Thus, an amount of light reflected by the light-reflecting member 205 toward the upper surface of the light-emitting device 200 is extremely small.

Further, Patent Literature 2 discloses a "light-reflecting member including at least in its surface a material capable of reflecting light from the light-emitting elements 202", and lists examples of the material as follows: $TiO_2$, $SiO_2$, alumina, and aluminum nitride, and mullite. However, filling the concave opening section 204 with such a material is difficult.

The technology disclosed herein has been accomplished in view of the above problems. It is an object of the technology disclosed herein to provide a light-emitting device that can be produced easily and that has high efficiency of extracting light from itself to the outside of the light-emitting device.

Solution to Problem

In order to solve the above problems, a light-emitting device of the technology disclosed herein includes: a base which is electrically insulating; a light-emitting element mounted on one side with respect to the base; a protection element mounted on the side and protecting the light-emitting element; and a light-reflecting member which reflects light and which covers the protection element, the light-reflecting member including a flexible transparent member and a filler, wherein the filler is added in the transparent member before the transparent member is cured, the filler reflecting or scattering the light and having a particle diameter larger than a wavelength of light emitted by the light-emitting element.

Advantageous Effects of Technology Disclosed Herein

According to the above arrangement, the protection element is covered with a light-reflecting member. This causes light emitted from the light-emitting element to be reflected by the light-reflecting member, instead of being absorbed by the protection element, so that such light is released to the outside of the light-emitting device.

The above arrangement allows the light-emitting device to extract light from itself to the outside with high efficiency. In addition, the light-reflecting member is prepared in a manner such that the filler is added in the transparent member before the transparent member is cured, the filler reflecting or scattering the light and having a particle diameter larger than a wavelength of light emitted by the light-emitting element. This allows for easy formation of the light-reflecting member having a desired pattern and position.

The above consequently allows for easy and low-cost production of a light-emitting device that extracts light from itself to the outside with high efficiency.

DESCRIPTION OF EMBODIMENTS

Example embodiments of the technology disclosed herein are described below with reference to FIGS. 1 through 7.

Embodiment 1

Figure 1:
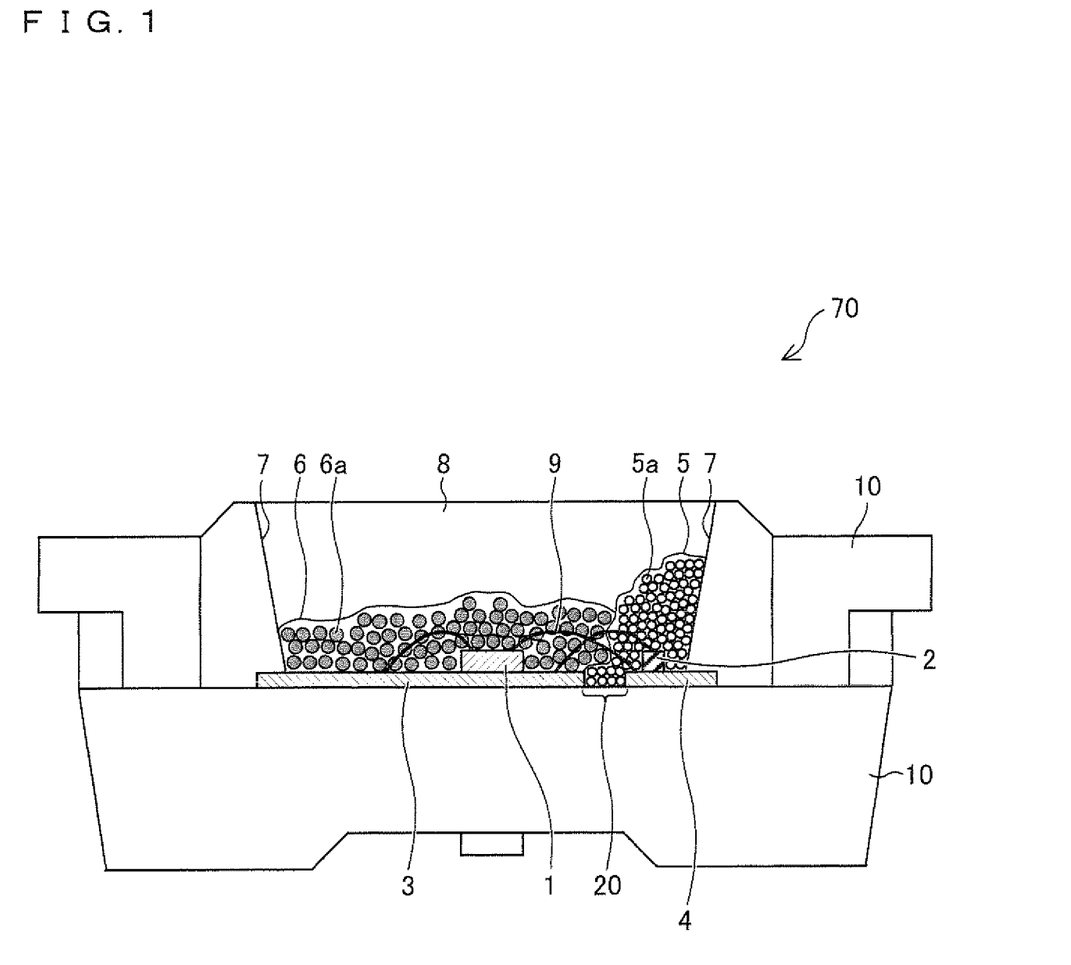
FIG. 1 is a cross-sectional view schematically illustrating a light-emitting device in accordance with Embodiment 1 of the technology disclosed herein.

FIG. 1 is a cross-sectional view schematically illustrating a light-emitting device 70 according to Embodiment 1 of the technology disclosed herein. The light-emitting device 70 is a light-emitting device (LED) that is of a side light-emitting type and that has a light-emitting/light-transmitting surface for emitting light to the outside, the surface being long and thin in shape. The light-emitting device 70 includes an insulating base 10 made of polyphthalamide (PPA); a light-emitting element 1 formed with a blue LED chip; and a protection element 2 formed with a Si Zener diode. The base 10 includes light-reflecting walls 7 defined by a concave opening section formed by a depression on a side of an upper surface, which corresponds to a light-emitting surface of the light-emitting device 70. The concave opening section has a bottom surface (corresponding to an upper surface of the base 10) provided with a first electrode 3 and a second electrode 4 formed thereon. The first and second electrodes 3 and 4 are each connected to an external electrode (not shown) so as to be connected to a power supply provided outside the light-emitting device 70.

The light-emitting element 1 is mounted on the first electrode 3 and adhered to it with a silicone resin, whereas the protection element 2 is mounted on the second electrode 4 and adhered to it with a silver paste. The light-emitting element 1 has two electrodes: one connected to the first electrode 3 and the other to the second electrode 4, each with a wire 9 made of gold. The protection element 2 also has one connected to the first electrode 3 with a wire 9; and another to the second electrode 4 with a silver paste. In other words, the light-emitting element 1 and the protection element 2 are connected to each other in parallel between the first and second electrodes 3 and 4.

The protection element 2 is covered with a light-reflecting filler-containing resin (light-reflecting member) 5. The filler-containing resin 5 is an insulating member formed with a transparent resin (transparent member) containing light-reflecting fillers 5a. The filler-containing resin 5 is formed in such a stretched shape as to fill a part of a groove 20 located between the first electrode 3, which is located between the light-emitting element 1 and the protection element 2, and the second electrode 4. The groove 20 is a gap between the first and second electrodes 3 and 4.

The light-emitting element 1 and the protection element 2 covered with the filler-containing resin 5 are sealed with a fluorescent-material-containing resin 6 filling the concave opening section of the base 10. The fluorescent-material-containing resin 6 contains yellow phosphors (fluorescent material) 6a that absorb blue light emitted from the light-emitting element 1 and release yellow light. The blue light emitted from the light-emitting element 1 is mixed with the yellow light released from the yellow phosphors (fluorescent material) 6a. The light-emitting device 70 thus releases white light.

The light-emitting device 70 of the side light-emitting type includes light-reflecting walls 7 formed at respective ends along a longitudinal direction (lateral direction of FIG. 1) of the concave opening section. The light-reflecting walls 7 have a slope that defines the concave opening section such that the concave opening section is narrower at a lower portion along a direction from above to its bottom. Further, the light-reflecting walls 7 are so sloped as to reflect light emitted from the light-emitting element 1 and light released from the yellow phosphors 6a, toward the outside of the light-emitting device 70. The light-reflecting walls 7 may further extend along the longitudinal direction (direction along which no light-reflecting wall 7 is shown in cross section; lateral direction of FIG. 1) of the concave opening section, in addition to a direction perpendicular to the longitudinal direction of the concave opening section. The filler-containing resin 5 has a surface continuous with a corresponding light-reflecting wall 7. The surface of the filler-containing resin 5 forms with the corresponding light-reflecting wall 7 a light-reflecting surface for reflecting light from the light-emitting element 1 to the outside of the light-emitting device 70.

According to the above arrangement, the protection element 2 is covered with the light-reflecting filler-containing resin 5. This causes light emitted from the light-emitting element 1 to be reflected by the filler-containing resin 5, instead of being absorbed by the protection element 2, so that such light is released to the outside of the light-emitting device 70. The filler-containing resin 5 has a surface so shaped as to reflect light emitted laterally from the light-emitting element 1, toward above (i.e., in a direction in which the concave opening section is faced). This allows the light-emitting device 70 to extract light from itself to the outside with high efficiency. In addition, the light-emitting element 1 and the protection element 2 are both placed on the bottom surface of the concave opening section. This eliminates the need to form a complex electrode pattern on the bottom surface of the concave opening section. This in turn allows for low-cost production of the light-emitting device 70.

The filler-containing resin 5 is formed in the groove 20 as well. This causes light from the light-emitting element 1 to be reflected from the groove 20. The filler-containing resin 5 is capable of reflecting toward above not only light emitted from the light-emitting element 1 but also light released from the fluorescent-material-containing resin 6.

The filler-containing resin 5 contains fillers 5a having a particle diameter larger than a wavelength of light from the light-emitting element 1. The particle diameter, for example, falls within a range from several μm to several tens of μm. The fillers 5a contained in the filler-containing resin 5 causes light from the light-emitting element 1 to be reflected (scattered) due to Mie scattering. In other words, the filler-containing resin 5 of the present embodiment even scatters light that has entered the filler-containing resin 5, thus increasing emission intensity achieved by the light-emitting device 70.

The light-emitting device 70 of the present embodiment can be produced through the following process.

First, the light-emitting element 1 is mounted on the first electrode 3 formed on the bottom surface of the concave opening section of the base 10. The light-emitting element 1 is then adhered to the first electrode 3 with a silicone resin. The protection element 2 is mounted on the second electrode 4 formed on the bottom surface of the concave opening section of the base 10. One electrode of the protection element 2 is electrically connected to the second electrode 4 with a silver paste. The protection element 2 is also fixed.

The two electrodes of the light-emitting element 1 are electrically connected to the first and second electrodes 3 and 4, respectively, with wires 9 made of gold. The other electrode of the protection element 2 is electrically connected to the first electrode 3 with a wire 9 made of gold.

Next, the filler-containing resin 5 is so formed by potting as to cover the protection element 2. The filler-containing resin 5 is prepared by kneading the fillers 5a made of $TiO_2$ with a silicone resin (transparent member), which is a flexible, insulating resin. The filler-containing resin 5 contains the fillers 5a at a proportion of, e.g., 50% by weight relative to the silicone resin. The silicone resin is either liquid or gelatinous.

Then, the filler-containing resin 5 is subjected to a temperature of 150° C. for 3 hours so as to be cured.

After that, the fluorescent-material-containing resin 6 is injected into the concave opening section of the light-emitting device 70. The fluorescent-material-containing resin 6 is then subjected to a temperature of 150° C. for 3 hours so as to be cured.

The foregoing curing results in formation of (i) a sealing resin layer 8 made of a light-transmitting silicone resin along a surface and its vicinity of the fluorescent-material-containing resin 6, the sealing resin layer 8 having a small number of the phosphors 6a, and (ii) a fluorescent-material-containing resin layer 6 in a vicinity of the light-emitting element 1, the fluorescent-material-containing resin layer 6 being formed as a result of settlement of the phosphors 6a. This allows for protection of the light-emitting element 1, the protection element 2, the fluorescent-material-containing resin 6, and the light-reflecting walls 7. The fluorescent-material-containing resin 6 is prepared by kneading yellow phosphors 6a made of $(Ba,Sr)_2SiO_4$:Eu and a light-transmitting silicone resin. The fluorescent-material-containing resin 6 contains the yellow phosphors 6a at a proportion of 0.173 by weight relative to the silicone resin.

The sealing resin layer 8 made of a light-transmitting silicone resin is not separated along a clear interface from the fluorescent-material-containing resin layer 6 formed with the phosphors 6a that have been settled in the vicinity of the light-emitting element 1.

The present embodiment uses a Zener diode as the protection element 2. However, the protection element 2 is not limited to this, and may thus be formed with either an element that has a short circuit to a reverse voltage possibly applied to the light-emitting element 1, or an element that has a short circuit to a forward voltage higher than or equal to a predetermined voltage higher than an operating voltage of the light-emitting element 1. Such an element is, for example, a transistor, a MOSFET, or an IC. The protection element 2 may be a publicly known protection element mounted in a light-emitting device. Such a protection element is, for example, an overheat protection element, an overvoltage protection element, an overcurrent protection element, or a static electricity protection element. The protection element 2 is preferably mounted in a corner of the concave opening section.

In addition, respective numbers of the light-emitting element 1 and the protection element 2 may be two or more. In this case, at least one of the protection elements 2 or preferably all the protection elements are covered with the filler-containing resin 5. Also, multiple light-emitting elements 1 emitting light having an identical color may be provided so as to improve luminous intensity. Further, for example, multiple light-emitting elements 1 corresponding the three primary colors of light may be provided in combination. This allows light emitted by the light-emitting device 70 to be adjusted as desired.

The fillers 5a in the filler-containing resin 5 may, for example, be $TiO_2$, $SiO_2$, alumina, aluminum nitride, or mullite. The resin of the filler-containing resin 5 may, for example, be a transparent resin excelling in weather resistance, such as an epoxy resin, a urea resin, a silicone resin, a modified epoxy resin, a modified silicone resin, or a polyamide resin. Further, the light-reflecting member covering the protection element 2 is not limited to a filler-containing resin. Thus, it may be any light-reflecting member that does not allow for a short circuit between the protection element 2, the wiring on the base 10, and the electrodes (the first and second electrodes 3 and 4). When the light-reflecting walls 7 are made of a material resistant to high temperatures, such as AlN or ceramics, the light-reflecting member may be a filler-containing glass. The light-reflecting member is simply required to reflect light emitted from the light-emitting element 1 and light released from the phosphors.

The light-transmitting resin (light-transmitting member) of the fluorescent-material-containing resin 6 may be a transparent resin excelling in weather resistance, such as an epoxy resin, a urea resin, a silicone resin, a modified epoxy resin, a modified silicone resin, or a polyamide resin. When the light-reflecting walls 7 are made of a material resistant to high temperatures, such as AlN or ceramics, the light-transmitting resin may be replaced with a light-transmitting member made of glass or the like.

As in the present embodiment, the phosphors preferably do not enter the light-reflecting member covering the protection element 2 so as not to be in direct contact with the protection element 2.

Embodiment 2

Figure 2:
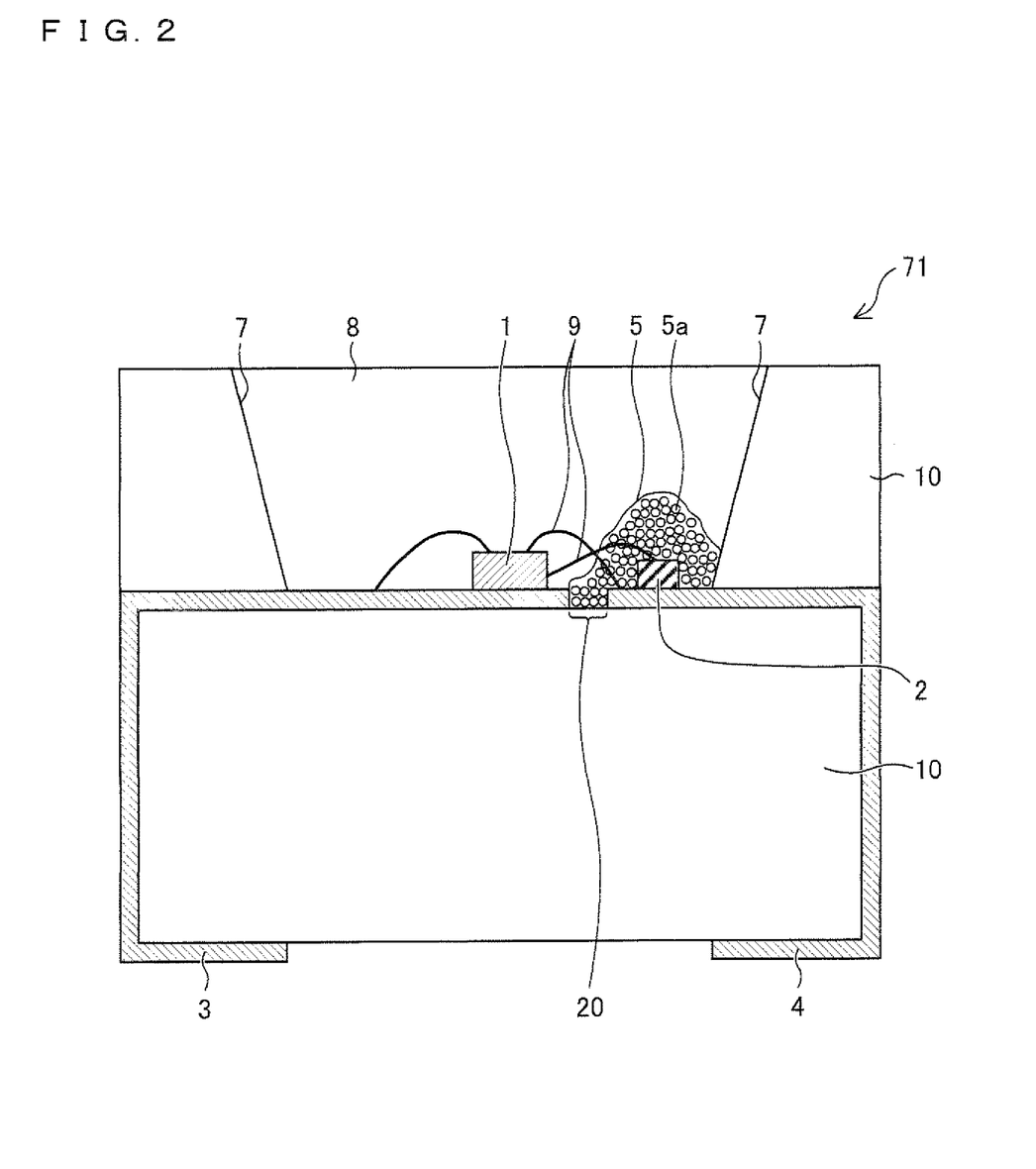
FIG. 2 is a cross-sectional view schematically illustrating a light-emitting device in accordance with Embodiment 2 of the technology disclosed herein.

FIG. 2 is a cross-sectional view schematically illustrating a light-emitting device 71 according to Embodiment 2 of the technology disclosed herein. Members and arrangements in the present embodiment that are functionally equivalent to their corresponding members and arrangements in Embodiment 1 are not described in detail here, and are assigned the same reference numerals.

The light-emitting device 71 is a surface mount light-emitting device (LED) having a light-emitting/light-transmitting surface for emitting light to the outside, the surface having a shape close to a circle. The light-emitting device 71 includes a base 10; a light-emitting element 1 formed with a green LED chip; and a protection element 2 formed with a Si Zener diode.

The base 10 includes a light-reflecting wall 7 defined by a concave opening section formed by a depression on an upper surface side. The concave opening section has a bottom surface provided with a first electrode 3 and a second electrode 4 formed thereon. The first and second electrodes 3 and 4 each extend over to have a portion below the base 10 so as to be connected to a power supply provided outside the light-emitting device 71.

The concave opening section has a side surface defined by the light-reflecting wall 7 having a slope such that the concave opening section is narrower at a lower portion along a direction from above to its bottom. The light-reflecting wall 7 of the present embodiment is so circumferentially formed as to surround the light-emitting element 1. This allows more of light from the light-emitting element 1 to be reflected to the outside of the light-emitting device 71.

The protection element 2 is covered with a light-reflecting filler-containing resin (light-reflecting member) 5. The filler-containing resin 5 of the present embodiment is so formed, in a convex shape, as to cover the protection element 2. This causes light emitted from the light-emitting element 1 toward the protection element 2 to be reflected toward above by a sloped surface of the filler-containing resin 5. This improves efficiency of extracting light from the light-emitting device 71 to the outside.

The light-emitting device 71 of the present embodiment can be produced through the following process.

First, the light-emitting element 1 is mounted on the first electrode 3 formed on the bottom surface of the concave opening section of the base 10 made of polyphthalamide (PPA). The light-emitting element 1 is then adhered to the first electrode 3 with a silicone resin. The protection element is mounted on the second electrode 4 formed on the bottom surface of the concave opening section of the base 10. One electrode of the protection element 2 is electrically connected to the second electrode 4 with a silver paste. The protection element 2 is also fixed.

The two electrodes of the light-emitting element 1 are electrically connected to the first and second electrodes 3 and 4, respectively, with wires 9 made of gold. The other electrode of the protection element 2 is electrically connected to the first electrode 3 with a wire 9 made of gold.

Next, the filler-containing resin 5 is formed by potting in such a convex shape as to cover the protection element 2. The filler-containing resin 5 is prepared by kneading fillers 5a made of $TiO_2$ with an insulating silicone resin (transparent member). The filler-containing resin 5 contains the fillers 5a at a proportion of, e.g., 50% by weight relative to the silicone resin. The silicone resin is flexible, and is either liquid or gelatinous.

Then, the filler-containing resin 5 is subjected to a temperature of 150° C. for 3 hours so as to be cured.

After that, a sealing resin 8 made of a light-transmitting silicone resin is injected into the concave opening section of the light-emitting device 71 so as to fill the concave opening section. The sealing resin 8 is then subjected to a temperature of 150° C. for 3 hours so as to be cured. This consequently allows for protection of the light-emitting element 1, the protection element 2, and the light-reflecting wall 7.

Embodiment 3

Figure 3:
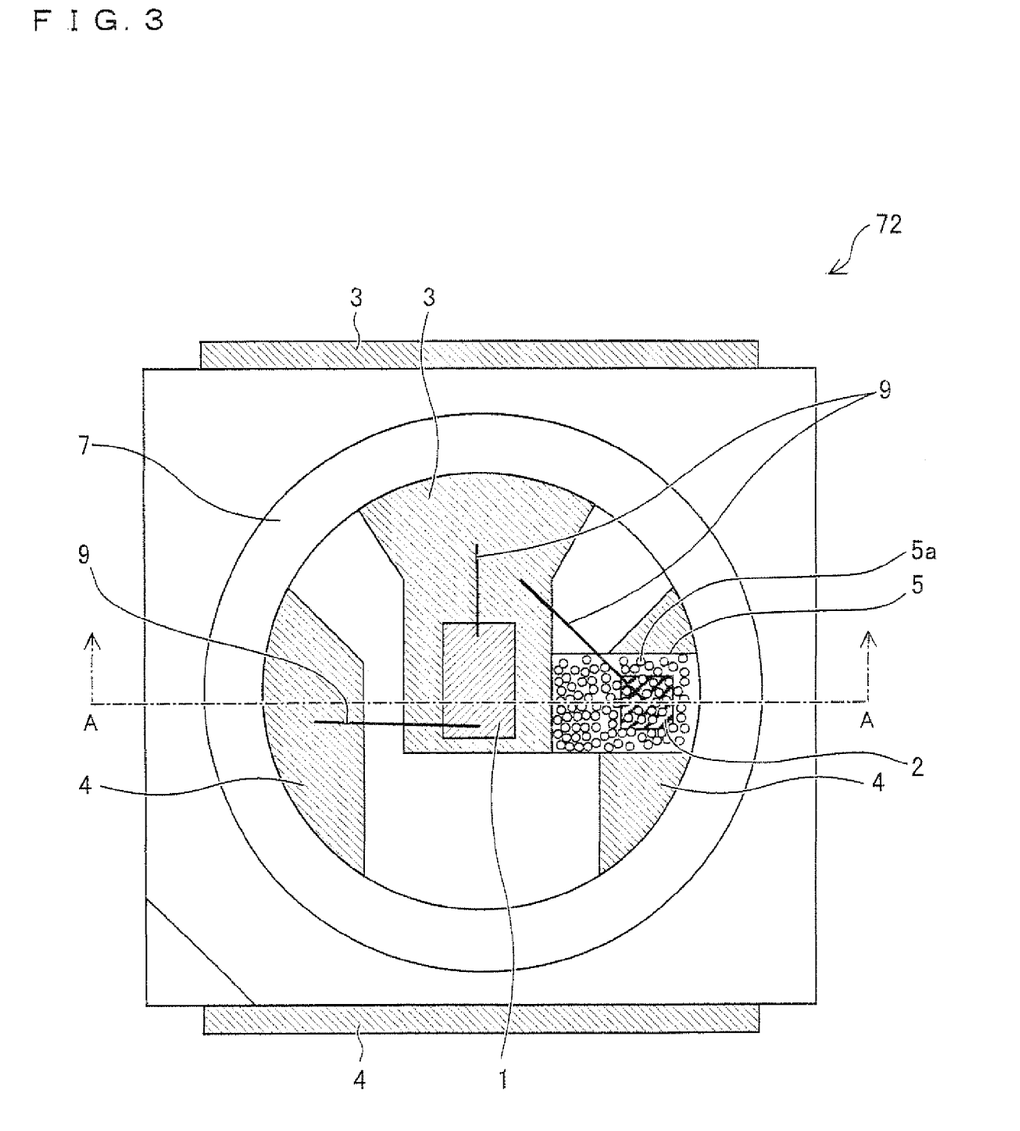
FIG. 3 is a cross-sectional view schematically illustrating a light-emitting device in accordance with Embodiment 3 of the technology disclosed herein.
Figure 4:
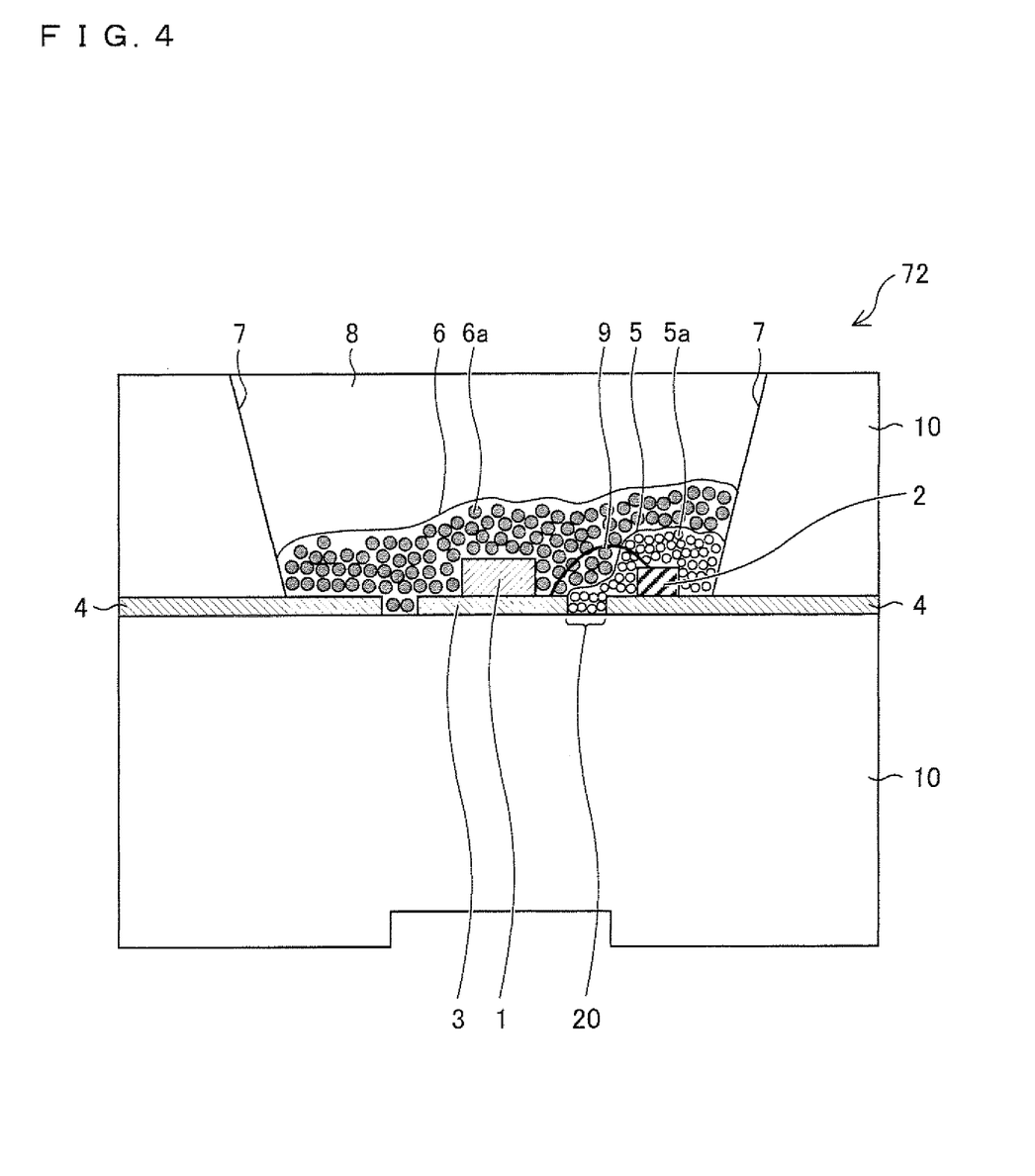
FIG. 4 is a cross-sectional view schematically illustrating a cross section along line A-A of FIG. 3.

FIG. 3 is a plan view schematically illustrating a light-emitting device 72 according to Embodiment 3 of the technology disclosed herein. FIG. 4 is a cross-sectional view schematically illustrating a cross section taken along line A-A of FIG. 3. FIG. 3 shows no phosphor or sealing resin for detailed illustration of an inside of a concave opening section. Members and arrangements in the present embodiment that are functionally equivalent to their corresponding members and arrangements in Embodiment 2 are not described in detail here, and are assigned the same reference numerals.

The light-emitting device 72 is a small-package light-emitting device (LED) having a light-emitting/light-transmitting surface for emitting light to the outside, the surface having a shape close to a circle. The light-emitting device 72 includes a base 10; a light-emitting element 1 formed with a blue LED chip; and a protection element 2 formed with a Si Zener diode.

The base 10 includes a light-reflecting wall 7 defined by the concave opening section formed by a depression on a side of an upper surface, i.e., a light-emitting surface. The concave opening section has a bottom surface provided with a first electrode 3 and a second electrode 4 formed thereon. The first and second electrodes 3 and 4 each extend beyond the base 10 so as to be connected to a power supply provided outside the light-emitting device 72.

The concave opening section has a side surface defined by the light-reflecting wall 7 having a slope such that the concave opening section is narrower at a lower portion along a direction from above to its bottom. The light-reflecting wall 7 of the present embodiment is so circumferentially formed as to surround the light-emitting element 1. This allows more of light from the light-emitting element 1 to be reflected to the outside of the light-emitting device 72.

The protection element 2 is covered with a light-reflecting filler-containing resin (light-reflecting member) 5. The filler-containing resin 5 of the present embodiment is so formed continuously as to cover the protection element 2 and a groove 20. The filler-containing resin 5 has a surface continuous with the light-reflecting wall 7. The surface of the filler-containing resin 5 forms with the light-reflecting wall 7 a light-reflecting surface for reflecting light from the light-emitting element 1 toward the outside of the light-emitting device 72.

According to the above arrangement, the light-emitting element 1 is circumferentially surrounded by the light-reflecting surface. This causes light emitted from the light-emitting element 1 to be reflected by the light-reflecting surface, instead of being absorbed by the protection element 2, so that such light is released to the outside of the light-emitting device 72.

The light-emitting element 1 and the filler-containing resin 5 are covered with a fluorescent-material-containing resin 6.

The light-emitting device 72 of the present embodiment can be produced through the following process.

First, the light-emitting element 1 is mounted on the first electrode 3 formed on the bottom surface of the concave opening section of the base 10 made of polyphthalamide (PPA). The light-emitting element 1 is then fixedly adhered to the first electrode 3 with a silicone resin. The protection element 2 is mounted on the second electrode 4 formed on the bottom surface of the concave opening section of the base 10. One electrode of the protection element 2 is electrically connected to the second electrode 4 with a silver paste. The protection element 2 is also fixed.

The two electrodes of the light-emitting element 1 are electrically connected to the first and second electrodes 3 and 4, respectively, with wires 9 made of gold. The other electrode of the protection element 2 is electrically connected to the first electrode 3 with a wire 9 made of gold.

Next, the filler-containing resin 5 is formed by potting in such a shape as to cover the protection element 2 and to be continuous with the light-reflecting wall 7. The filler-containing resin 5 is prepared by kneading fillers 5a made of $TiO_2$ with an insulating silicone resin (transparent member). The filler-containing resin 5 contains the fillers 5a at a proportion of, e.g., 45% by weight relative to the silicone resin. The silicone resin is flexible, and is either liquid or gelatinous.

Then, the filler-containing resin 5 is subjected to a temperature of 150° C. for 3 hours so as to be cured.

After that, the fluorescent-material-containing resin 6 is injected into the concave opening section of the light-emitting device 72. The fluorescent-material-containing resin 6 is then subjected to a temperature of 150° C. for 3 hours so as to be cured.

The foregoing curing results in formation of (i) a sealing resin layer 8 made of a light-transmitting silicone resin along a surface and its vicinity of the fluorescent-material-containing resin 6, the sealing resin layer 8 having a small number of phosphors 6a, and (ii) a fluorescent-material-containing resin layer 6 in a vicinity of the light-emitting element 1, the fluorescent-material-containing resin layer 6 being formed as a result of settlement of the phosphors 6a. This allows for protection of the light-emitting element 1, the protection element 2, the fluorescent-material-containing resin 6, and the light-reflecting wall 7.

The fluorescent-material-containing resin 6 is prepared by kneading yellow phosphors 6a made of $(Ba,Sr)_2SiO_4:Eu$ with a light-transmitting silicone resin. The fluorescent-material-containing resin 6 contains the yellow phosphors 6a at a proportion of 0.118% by weight relative to the silicone resin.

Embodiment 4

Figure 5:
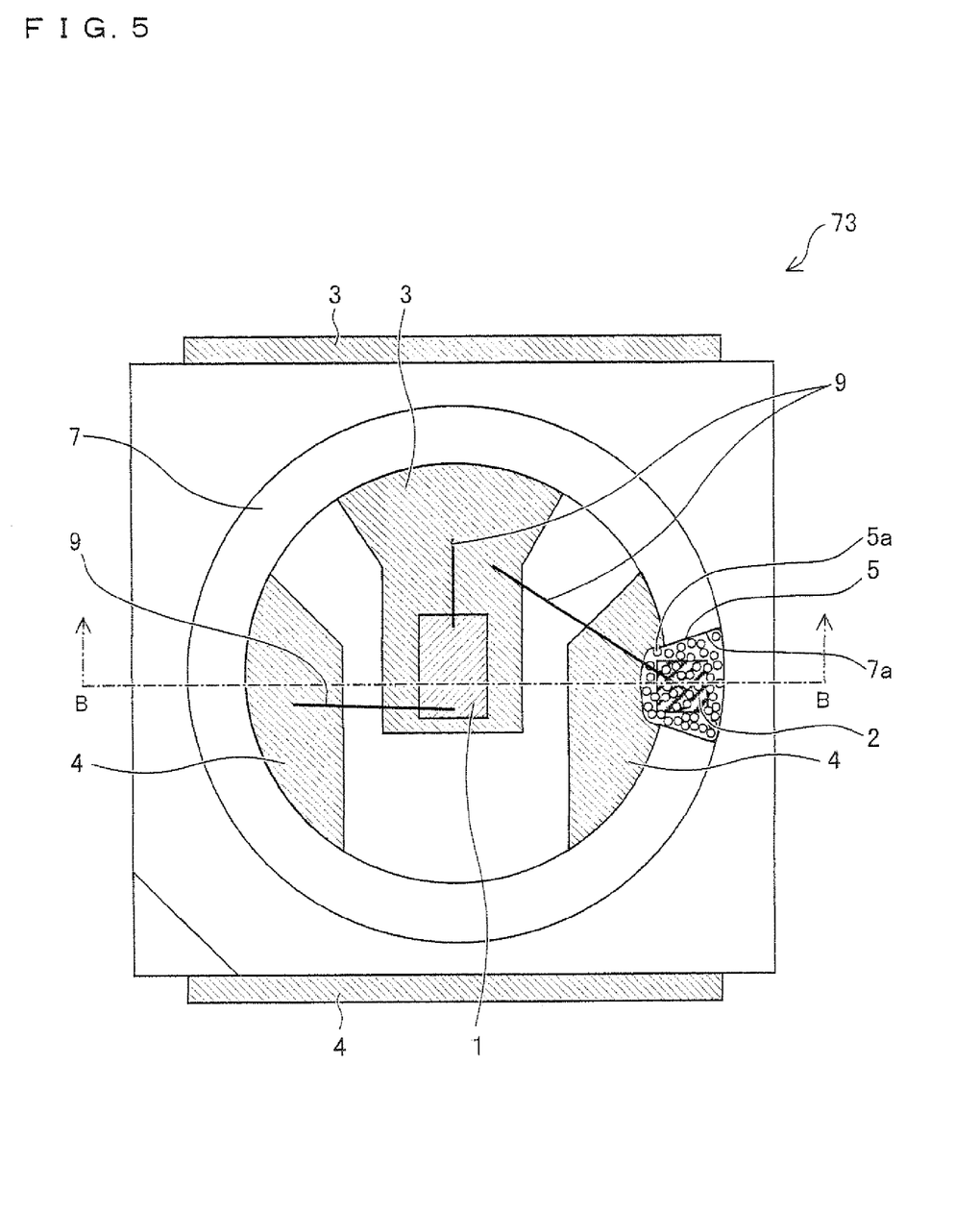
FIG. 5 is a cross-sectional view schematically illustrating a light-emitting device in accordance with Embodiment 4 of the technology disclosed herein.
Figure 6:
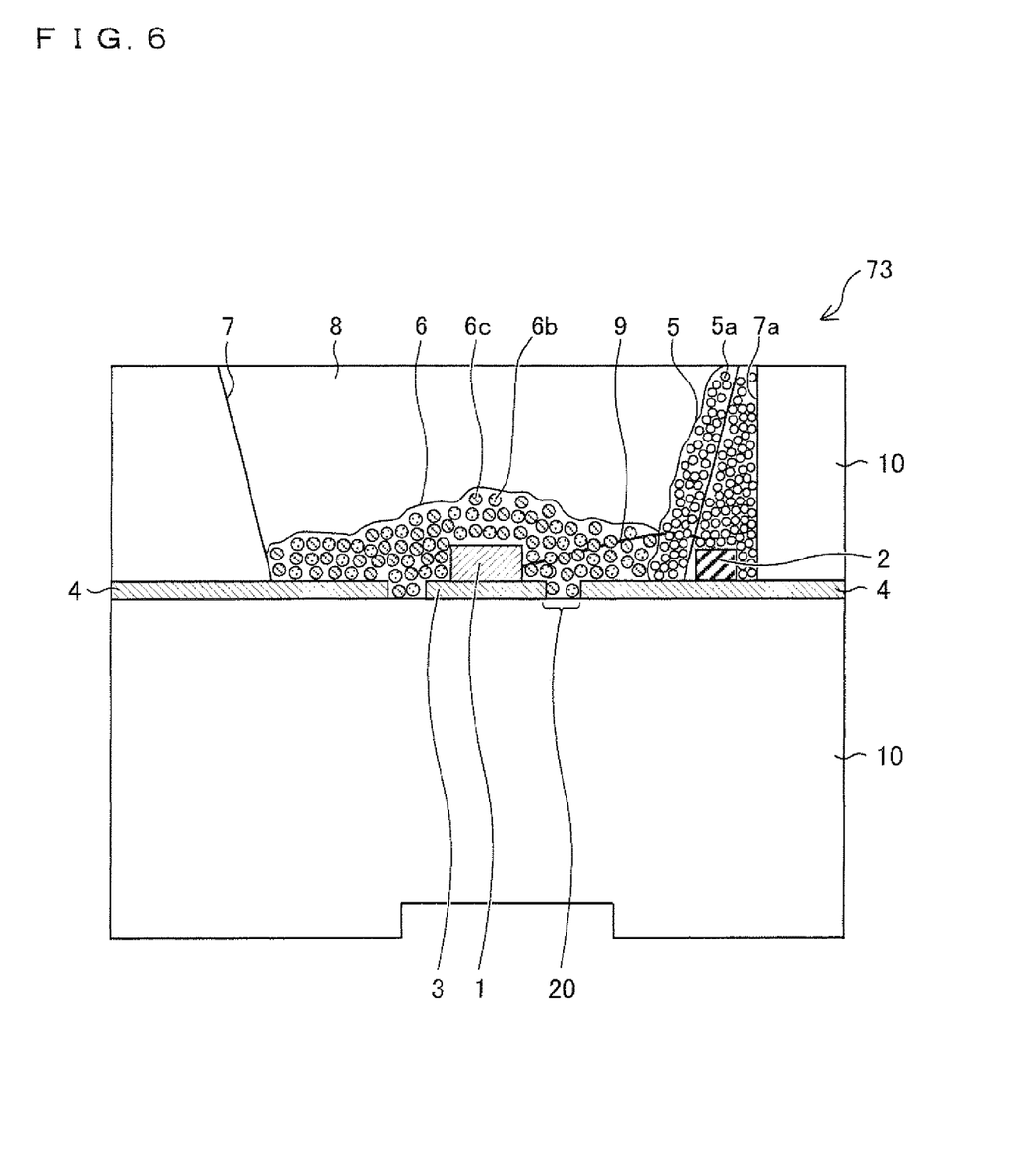
FIG. 6 is a cross-sectional view schematically illustrating a cross section along line B-B of FIG. 5.

FIG. 5 is a plan view schematically illustrating a light-emitting device 73 according to Embodiment 4 of the technology disclosed herein. FIG. 6 is a cross-sectional view schematically illustrating a cross section taken along line B-B of FIG. 5. FIG. 5 shows no phosphor or sealing resin for detailed illustration of an inside of a concave opening section. Members and arrangements in the present embodiment that are functionally equivalent to their corresponding members and arrangements in Embodiment 3 are not described in detail here, and are assigned the same reference numerals.

A base 10 includes a light-reflecting wall 7 defined by the concave opening section formed by a depression on a side of an upper surface, i.e., a light-emitting surface. The concave opening section has a bottom surface provided with a first electrode 3 and a second electrode 4 formed thereon. The first and second electrodes 3 and 4 each extend beyond the base 10 so as to be connected to a power supply provided outside the light-emitting device 73.

The concave opening section has a side surface defined by the light-reflecting wall 7 having a slope such that the concave opening section is narrower at a lower portion along a direction from above to its bottom. The light-reflecting wall 7 of the present embodiment is so formed as to surround a light-emitting element 1. The light-reflecting wall 7 has a hole section (recess) 7a at a portion thereof. In the present embodiment, the hole section 7a has a bottom surface formed with a portion of the second electrode 4. The hole section 7a of the light-reflecting wall 7 contains a protection element 2 mounted on the second electrode 4. One electrode of the protection element 2 is electrically connected to the second electrode 4 with a silver paste.

The protection element 2 is covered with a light-reflecting filler-containing resin (light-reflecting member) 5. The filler-containing resin 5 of the present embodiment is so formed as to cover the protection element 2 and to fill the hole section 7a of the light-reflecting wall 7. The filler-containing resin 5 has a surface facing the light-emitting element 1, the surface being continuous with the light-reflecting wall 7. Such a surface of the filler-containing resin forms with the light-reflecting wall 7 a continuous, light-reflecting surface for reflecting light from the light-emitting element 1 toward the outside of the light-emitting device 73.

According to the above arrangement, the light-emitting element 1 is circumferentially surrounded by the continuous light-reflecting surface. This causes light emitted from the light-emitting element 1 to be reflected by the light-reflecting surface, instead of being absorbed by the protection element 2, so that such light is released to the outside of the light-emitting device 73. In addition, the above arrangement causes light emitted from the light-emitting element 1 to be reflected by the sloped light-reflecting surface toward above (i.e., toward a light-emitting surface of the light-emitting device 73). This improves efficiency of extracting light from the light-emitting device 73 to the outside.

A portion of the light-reflecting surface, the portion being formed with the filler-containing resin 5, is preferably identical in shape to a portion of the light-reflecting surface, the portion being formed with the light-reflecting wall 7. This allows light from the light-emitting element 1 to be reflected in a uniform direction without irregularities, thus reducing color and luminance unevenness of the light-emitting device 73.

Further, the above arrangement eliminates the need to dispose the protection element 2 in the concave opening section. This saves space and thus allows for downsizing of the light-emitting device 73. In addition, the above arrangement allows the hole section 7a to have its bottom surface flush with the bottom surface of the concave opening section. This allows each of the first and second electrodes 3 and 4, both formed in the concave opening section, to have a simple pattern, and further allows the protection element 2, which has one electrode on one of its sides, to be readily connected to the second electrode 4 with a silver paste. This in turn allows for low-cost production of the light-emitting device 73.

The light-emitting element 1, formed with a blue LED, is covered with a fluorescent-material-containing resin 6 containing green phosphors 6b and red phosphors 6c. This causes the light-emitting device 73 to emit white light.

The hole section (recess) 7a of the present embodiment is shaped by removing a portion of the light-reflecting wall 7 along a direction from the bottom surface of the concave opening section through to its upper surface. However, the shape of the hole section 7a is not limited to this. It may be shaped by forming a recess in a portion of a surface of the light-reflecting wall 7, the surface reflecting light, and leaving unremoved a portion of the light-reflecting wall 7, the portion being located on an upper side of the recess.

The light-emitting device 73 of the present embodiment can be produced through the following process.

First, a portion of the light-reflecting wall 7 of the base 10 made of polyphthalamide (PPA) is removed so that the hole section 7a is so formed as to expose the second electrode 4 formed on the bottom surface of the concave opening section.

The light-emitting element 1 is mounted on the first electrode 3 formed on the bottom surface of the concave opening section of the base 10. The light-emitting element 1 is then adhered to the first electrode 3 with a silicone resin. The protection element 2 is mounted on the second electrode 4, in the hole section 7a of the light-reflecting wall 7. One electrode of the protection element 2 is electrically connected to the second electrode 4 with a silver paste. The protection element 2 is also fixed.

The two electrodes of the light-emitting element 1 are electrically connected to the first and second electrodes 3 and 4, respectively, with wires 9 made of gold. The other electrode of the protection element 2 is electrically connected to the first electrode 3 with a wire 9 made of gold.

Next, the protection element 2 is covered with a filler-containing resin 5 formed by potting in such a shape as to have a surface forming a light-reflecting surface continuous with the light-reflecting wall 7. The filler-containing resin 5 is prepared by kneading fillers 5a, made of alumina, with an insulating silicone resin (transparent member). The filler-containing resin 5 contains the fillers 5a at a proportion of, e.g., 45% by weight relative to the silicone resin. The silicone resin is a silicone resin having a high viscosity of 2 Pa·s. The silicone resin is flexible, and is either liquid or gelatinous.

Then, the filler-containing resin 5 is subjected to a temperature of 150° C. for 3 hours so as to be cured. The filler-containing resin 5 fills the hole section 7a formed by removing a portion of the light-reflecting wall 7. Further, the filler-containing resin 5 has a surface forming a light-reflecting surface continuous with the light-reflecting wall 7.

After the above, the fluorescent-material-containing resin 6 is injected into the concave opening section of the light-emitting device 73, i.e., into a space surrounded by the light-reflecting wall 7. The fluorescent-material-containing resin 6 is then subjected to a temperature of 150° C. for 3 hours so as to be cured.

The foregoing curing results in formation of (i) a sealing resin layer 8 made of a light-transmitting silicone resin along a surface and its vicinity of the fluorescent-material-containing resin 6, the sealing resin layer 8 having a small number of the phosphors 6b and 6c, and (ii) a fluorescent-material-containing resin layer 6 in a vicinity of the light-emitting element 1, the fluorescent-material-containing resin layer 6 being formed as a result of settlement of the phosphors 6b and 6c. This allows for protection of the light-emitting element 1, the protection element 2, the fluorescent-material-containing resin 6, and the light-reflecting wall 7. The fluorescent-material-containing resin 6 is prepared by kneading green phosphors 6b made of $Ca_3(Sc,Mg)_2Si_3O_{12}$:Ce; red phosphors 6c made of $CaAlSiN_3$:Eu; and a light-transmitting silicone resin. The fluorescent-material-containing resin 6 contains the phosphors, i.e., the combination of the green phosphors 6b and the red phosphors 6c, at a proportion of 0.118% by weight relative to the silicone resin. The silicone resin has a viscosity of 0.3 Pa·s.

The filler-containing resin 5 of the present embodiment includes a silicone resin having a high viscosity. This allows for easy formation of the filler-containing resin 5 having a surface substantially identical in shape to the surface of the light-reflecting wall 7. This in turn allows for easy formation of the filler-containing resin 5 having a surface forming a light-reflecting surface continuous with the light-reflecting wall 7.

Embodiment 5

Figure 7:
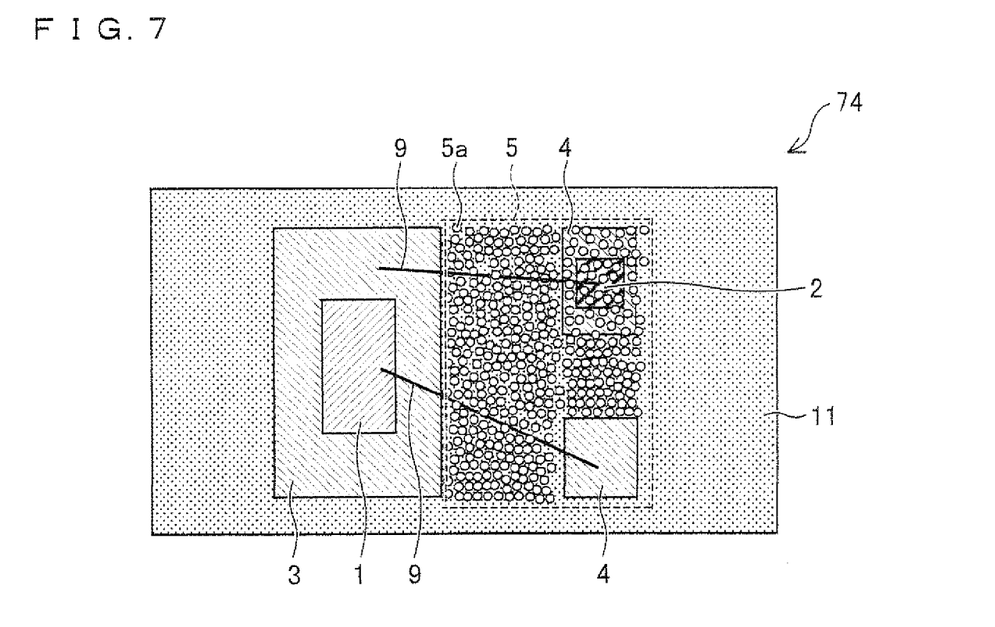
FIG. 7 is a cross-sectional view schematically illustrating a light-emitting device in accordance with Embodiment 5 of the technology disclosed herein.
Figure 8:
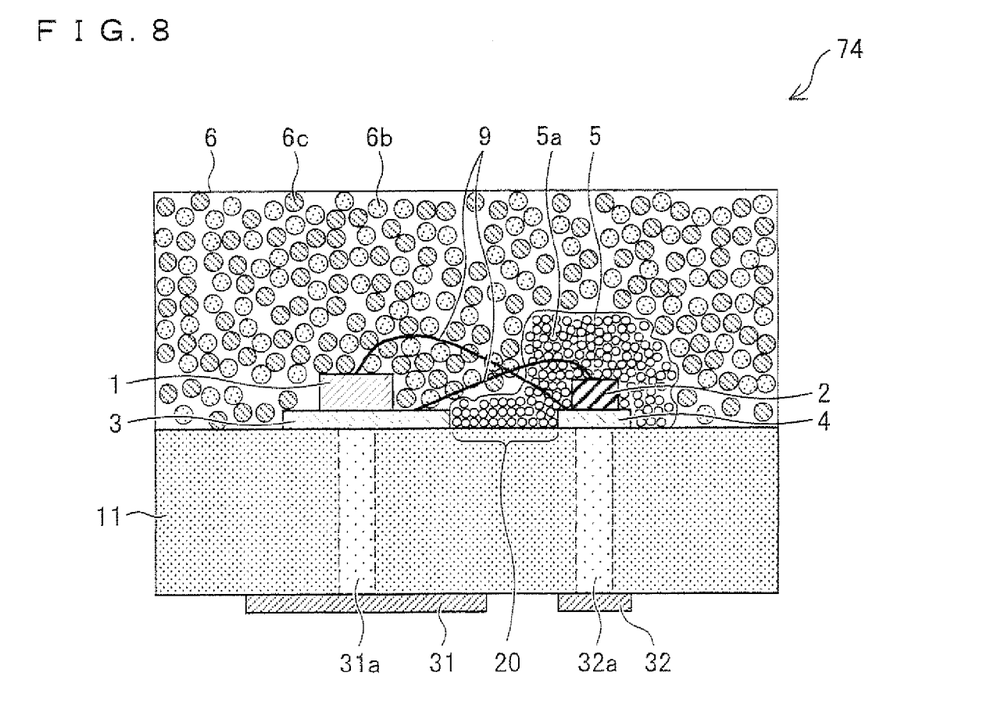
FIG. 8 is a cross-sectional view schematically illustrating the light-emitting device of FIG. 7.

FIG. 7 is a plan view schematically illustrating a light-emitting device 74 according to Embodiment 5 of the technology disclosed herein. FIG. 8 is a cross-sectional view schematically illustrating the light-emitting device 74 of FIG. 7. FIG. 7 shows no phosphor or sealing resin. Members and arrangements in the present embodiment that are functionally equivalent to their corresponding members and arrangements in Embodiment 4 are not described in detail here, and are assigned the same reference numerals.

The light-emitting device 74 is a surface mount light-emitting device (LED) having a light-emitting surface formed above a substrate 11. The light-emitting device 74 includes the substrate 11; a light-emitting element 1 formed with a blue LED chip; and a protection element 2 formed with a Si Zener diode.

The insulating substrate (base) 11 formed with an AlN substrate has an upper surface (closer than the other surface to a light-emitting surface of the light-emitting device 74) provided with a first electrode 3 and a second electrode 4. The substrate 11 has a lower surface provided with external connection lands 31 and 32 so positioned as to face the first and second electrodes 3 and 4, respectively, across the substrate 11. The external connection lands 31 and 32 allow the first and second electrodes 3 and 4 to be connected to an external power supply. The first and second electrodes 3 and 4 are electrically connected to the external connection lands 31 and 32 via through holes 31a and 32a, respectively, formed through the substrate 11.

The light-emitting element 1 is mounted on the first electrode 3 and adhered to it with a silver paste, whereas the protection element 2 is mounted on the second electrode 4 and adhered to it with a silver paste. The light-emitting element 1 has two electrodes: one connected to the second electrode 4 with a wire 9 made of gold and the other to the first electrode 3 with silver past. The protection element 2 also has two electrodes: one connected to the first electrode 3 with a wire 9 and the other to the second electrode 4 with a silver paste. In other words, the light-emitting element 1 and the protection element 2 are connected to each other in parallel between the first and second electrodes 3 and 4.

The protection element 2 is covered with a light-reflecting filler-containing resin (light-reflecting member) 5. The filler-containing resin 5 of the present embodiment is formed in such a convex shape as to cover the protection element 2. Further, the filler-containing resin 5 is so formed continuously as to cover a groove 20. This causes light emitted from the light-emitting element 1 toward the protection element 2 to be reflected toward above by a sloped surface of the filler-containing resin 5. This improves efficiency of extracting light from the light-emitting device 74 to the outside.

The light-emitting element 1 and the filler-containing resin 5 are covered with a fluorescent-material-containing resin 6.

The light-emitting device 74 of the present embodiment can be produced through the following process.

The light-emitting element 1 is mounted on the first electrode 3 formed on an upper surface of the substrate 11 made of an AlN substrate. One electrode of the light-emitting element 1 is electrically connected to the first electrode 3 with a silver paste. The light-emitting element 1 is also fixed. The protection element 2 is mounted on the second electrode 4 formed on the upper surface of the substrate 11. One electrode of the protection element 2 is electrically connected to the second electrode 4 with a silver paste. The protection element 2 is also fixed.

The other electrode of the light-emitting element 1 is electrically connected to the second electrode 4 with a wire 9 made of gold. The other electrode of the protection element 2 is electrically connected to the first electrode 3 with a wire 9 made of gold.

Next, the filler-containing resin 5 is formed by potting in such a convex shape as to cover the protection element 2. Further, the filler-containing resin 5 is so formed as to also cover the groove 20 between the first and second electrodes 3 and 4. The filler-containing resin 5 is prepared by kneading fillers 5a made of $SiO_2$ with an insulating silicone resin (transparent member). The filler-containing resin 5 contains the fillers 5a at a proportion of, e.g., 50% by weight relative to the silicone resin. The silicone resin is flexible, and is either liquid or gelatinous.

Then, the filler-containing resin 5 is subjected to a temperature of 150° C. for 3 hours so as to be cured.

After that, the fluorescent-material-containing resin 6 is formed in such a cuboid shape as to cover the light-emitting element 1 and the filler-containing resin 5. The fluorescent-material-containing resin 6 is then subjected to a temperature of 150° C. for 3 hours so as to be cured. The fluorescent-material-containing resin 6 is prepared by kneading (i) green phosphors 6b made of $(Si,Al)_6(O,N)_8$:Eu; (ii) red phosphors 6c made of $CaAlSiN_3$:Eu; and (iii) a light-transmitting silicone resin. The fluorescent-material-containing resin 6 contains the phosphors, i.e., the combination of the green phosphors 6b and the red phosphors 6c, at a proportion of 0.1% by weight relative to the silicone resin. This allows for protection of the light-emitting element 1 and the protection element 2.

[Filler-Containing Resin]

The fillers contained in the filler-containing resin reflect (scatter) light by Mie scattering. Thus, the fillers preferably have a particle diameter larger than a wavelength of light from the light-emitting element 1. In a case of mixing fillers with a resin as in the technology disclosed herein, fillers having a refractive index larger than a refractive index of the resin produce a greater reflecting effect. Thus, the fillers preferably have a large refractive index.

Non Patent Literature 1 lists various materials and their respective refractive indexes. These are examples of applicable fillers.

[Fluorescent Material]

The fluorescent material may be $Ca(Si,Al)_{12}(O,N)_{16}$:Eu, which is an Eu (europium)-activated α-sialon which emits yellow fluorescent light; or a BOSE:Eu such as $(Ba,Sr)_2SiO_4$, $(Y,Gd)_3Al_5O_{12}$:Ce, or $Tb_3Al_8O_{12}$:Ce.

The fluorescent material may also be $(Ba,Mg)Al_{10}O_{17}$:Eu, Mn, which emits green fluorescent light, or Eu (europium)-activated β-sialon such as $(Si,Al)_6(O,N)_8$:Eu; $SrAl_2O_4$:Eu; $Ba_{1.5}Sr_{0.5}SiO_4$:Eu; $BaMgAl_{10}O_{17}$:Eu,Mn; $Ca_3(Sc,Mg)_2Si_3O_{12}$:Ce; $Lu_3Al_5O_{12}$:Ce; $CaSc_2O_4$:Ce, ZnS:Cu,Al; (Zn,Cd)S:Cu,Al; $Y_3Al_5O_{12}$:Tb; $Y_3(Al,Ga)_5O_{12}$:Tb; $Y_2SiO_5$:Tb; $Zn_2SiO_4$:Mn; (Zn,Cd)S:Cu; ZnS:Cu; $Gd_2O_2S$:Tb; (Zn, Cd)S:Ag; $Y_2O_2S$:Tb; $(Zn,Mn)_2SiO_4$; $BaAl_{12}O_{19}$:Mn; $(Ba,Sr,Mg)O.Al_2O_3$:Mn; $LaPO_4$:Ce,Tb; $Zn_2SiO_4$:Mn; $CeMgAl_{11}O_{19}$:Tb; or $BaMgAl_{10}O_{17}$:Eu,Mn.

The fluorescent material may also be a Eu (europium) activated pure nitride which emits red fluorescent light, such as cousin ($CaAlSiN_3$:Eu); $(Sr,Ca)AlSiN_3$:Eu; $Y_2O_2S$:Eu; $Y_2O_3$:Eu; $Zn_3(PO_4)_2$:Mn; $(Y,Gd,Eu)BO_3$; $(Y,Gd,Eu)_2O_3$; $YVO_4$:Eu or $La_2O_2S$:Eu,Sm.

The fluorescent material for use may naturally be any combination of the above fluorescent materials or a known fluorescent material other than the above fluorescent materials.

[Variations]

In order to solve the above problems, a light-emitting device of the technology disclosed herein includes: a base which is electrically insulating; a light-emitting element mounted on one side with respect to the base; a protection element mounted on the side and protecting the light-emitting element; and a light-reflecting member which reflects light and which covers the protection element, the light-reflecting member including a flexible transparent member and a filler, wherein the filler is added in the transparent member before the transparent member is cured, the filler reflecting or scattering the light and having a particle diameter larger than a wavelength of light emitted by the light-emitting element.

According to the above arrangement, the protection element is covered with a light-reflecting member. This causes light emitted from the light emitting element to be reflected by the light-reflecting member, instead of being absorbed by the protection element, so that such light is released to the outside of the light-emitting device.

The above arrangement allows the light-emitting device to extract light from itself to the outside with high efficiency. In addition, the light-reflecting member is prepared in a manner such that the filler is added in the transparent member before the transparent member is cured, the filler reflecting or scattering the light and having a particle diameter larger than a wavelength of light emitted by the light-emitting element. This allows for easy formation of the light-reflecting member having a desired pattern and position.

The above consequently allows for easy and low-cost production of a light-emitting device that extracts light from itself to the outside with high efficiency.

The light-emitting device of the technology disclosed herein may further include a light-reflecting wall provided on the side, the light-reflecting wall being light-reflective and surrounding the light-emitting element, wherein the light-reflecting wall has a recess at a portion thereof, and the protection element is disposed in the recess.

According to the above arrangement, the protection element is disposed in the recess of the light-reflecting wall. This saves space for disposition of the protection element.

The above in turn allows for downsizing of the light-emitting device.

The light-emitting device of the technology disclosed herein may be arranged such that the light-reflecting member has a surface continuous with the light-reflecting wall; the surface of the light-reflecting member and the light-reflecting wall form a light-reflecting surface together, the light-reflecting surface reflecting the light from the light-emitting element toward an outside of the light-emitting device; and the light-reflecting surface is a continuous surface surrounding the light-emitting element.

According to the above arrangement, the light-reflecting member covering the protection element forms with the light-reflecting wall a continuous light-reflecting surface. This allows light from the light-emitting element to be reflected toward the outside of the light-emitting device with higher efficiency.

The light-emitting device of the technology disclosed herein may be arranged such that a first portion of the light-reflecting surface is identical in shape to a second portion thereof, where the first portion is formed with the light-reflecting member, and the second portion is formed with the light-reflecting wall.

According to the above arrangement, the portion of the light-reflecting surface, the portion being formed with the light-reflecting member, is identical in shape to the portion of the light-reflecting surface, the portion formed with the light-reflecting wall. This allows light from the light-emitting element to be reflected uniformly toward the outside.

The above in turn reduces luminance and color unevenness of the light-emitting device.

The light-emitting device of the technology disclosed herein may further include: two electrodes formed on the base; and a light-reflecting member in at least part of a gap between the electrodes.

According to the above arrangement, the portion of the light-reflecting member, the portion being formed in the gap between the electrodes, causes light toward the gap between the electrodes to be reflected.

The above consequently prevents light from being absorbed in the gap between the electrodes.

This improves light extraction efficiency.

The light-emitting device of the technology disclosed herein may be arranged such that the light-emitting element is covered with a light-transmitting member.

The above arrangement allows the light-transmitting member to protect the light-emitting element.

The light-emitting device of the technology disclosed herein may be arranged such that the light-transmitting member contains a fluorescent material which absorbs light from the light-emitting element and which emits light having a wavelength longer than a wavelength of the light thus absorbed.

The above arrangement allows the fluorescent material to absorb light from the light-emitting element and to release light having a different wavelength. This allows for adjustment of light emitted by the light-emitting device.

The light-emitting device of the technology disclosed herein may be arranged such that a plurality of the protection elements are provided and covered with the light-reflecting member.

The light-emitting device of the technology disclosed herein may be arranged such that a plurality of the protection elements are provided and covered with the light-reflecting member.

The above arrangements protect the light-emitting element against various influences.

The light-emitting device of the technology disclosed herein may be arranged such that the protection element includes a Zener diode which protects the light-emitting element against a reverse voltage applied to the light-emitting element or a forward overvoltage applied thereto.

According to the above arrangement, the protection element includes a Zener diode, which is inexpensive and easy to handle. This allow for easy and low-cost production of the light emitting device.

The light-emitting device of the technology disclosed herein may be arranged such that the transparent member includes a transparent resin or glass. The glass is preferably, e.g., a silica glass prepared by sol-gel method.

The above arrangement allows for easy formation of the light-reflecting member.

The light-emitting device of the present invention may be arranged such that the filler includes $TiO_2$, $SiO_2$, alumina, aluminum nitride, or mullite.

According to the above arrangement, the filler has a large refractive index, which in turn improves a reflecting effect of the light-reflecting member.

The above thus allows the light-emitting device to extract light from itself to the outside with high efficiency.

The light-emitting device of the technology disclosed herein may be arranged such that the transparent resin includes an epoxy resin, a urea resin, silicone, a modified epoxy resin, a modified silicone resin, or polyamide.

The technology disclosed herein is not limited to the description of the embodiments above, but may be altered by a skilled person within the scope of the claims. An embodiment based on a proper combination of technical means disclosed in different embodiments is encompassed in the technical scope of the technology disclosed herein.

INDUSTRIAL APPLICABILITY

The technology disclosed herein is applicable to light sources for use in, e.g., illumination devices, various indicators, vehicles, display devices, and backlight devices for liquid crystal.

REFERENCE SIGNS LIST

70, 71, 72, 73, 74 light-emitting device
1 light-emitting element
2 protection element
3 first electrode
4 second electrode
5 filler-containing resin (light-reflecting member)
5a filler
6 fluorescent-material-containing resin (light-transmitting member)
6a, 6b, 6c phosphor
7 light-reflecting wall
7a hole section (recess)
8 sealing resin (light-transmitting member)
9 wire

The invention claimed is:

1. A light-emitting device comprising:
a base which is electrically insulating;
a light-emitting element mounted on one side with respect to the base;
a protection element mounted on the side and protecting the light-emitting element;
a light-reflecting member which reflects light and which covers the protection element, the light-reflecting member including a flexible transparent member and a filler, wherein the filler is added in the transparent member before the transparent member is cured, the filler reflecting or scattering the light and having a particle diameter larger than a wavelength of light emitted by the light-emitting element; and
a light-reflecting wall provided on the side, the light-reflecting wall being light-reflective and surrounding the light-emitting element;
wherein:
the light-reflecting wall has a recess at a portion thereof, and the protection element is disposed in the recess;
the light-reflecting member has a surface continuous with the light-reflecting wall;
the surface of the light-reflecting member and the light-reflecting wall form a light-reflecting surface together, the light-reflecting surface reflecting the light from the light-emitting element toward an outside of the light-emitting device;
the light-reflecting surface is a continuous surface surrounding the light-emitting element; and,
the light-emitting element is not covered with the light-reflecting member.

2. A light-emitting device comprising:
a base which is electrically insulating;
a light-emitting element mounted on one side with respect to the base;
a protection element mounted on the side and protecting the light-emitting element;
a light-reflecting member which reflects light and which covers the protection element,
the light-reflecting member including a flexible transparent member and a filler, wherein the filler is added in the transparent member before the transparent member is cured, the filler reflecting or scattering the light and having a particle diameter larger than a wavelength of light emitted by the light-emitting element; and
a light-reflecting wall provided on the side, the light-reflecting wall being light-reflective and surrounding the light-emitting element,
wherein:
the light-reflecting member has a surface continuous with the light-reflecting wall;
the surface of the light-reflecting member and the light-reflecting wall form a light-reflecting surface together, the light-reflecting surface reflecting the light from the light-emitting element toward an outside of the light-emitting device; and
the light-emitting element is not covered with the light-reflecting member.

3. The light-emitting device according to claim 1, wherein: a first portion of the light-reflecting surface is identical in shape to a second portion thereof, where the first portion is formed with the light-reflecting member, and the second portion is formed with the light-reflecting wall.

4. The light-emitting device according to claim 1, further comprising:
two electrodes formed on the base; and
a light-reflecting member in at least part of a gap between the electrodes.

5. The light-emitting device according to claim 1, wherein the light-emitting element is covered with a light-transmitting member.

6. The light-emitting device according to claim 5, wherein the light-transmitting member contains a fluorescent material which absorbs light from the light-emitting element and which emits light having a wavelength longer than a wavelength of the light thus absorbed.

7. The light-emitting device according to claim 1, wherein a plurality of the protection elements are provided and covered with the light-reflecting member.

8. The light-emitting device according to claim 1, wherein the protection element protects the light-emitting element against an overheat, an overvoltage, or an overcurrent.

9. The light-emitting device according to claim 1, wherein the protection element comprises a Zener diode which protects the light-emitting element against a reverse voltage applied to the light-emitting element or a forward overvoltage applied thereto.

10. The light-emitting device according to claim 1, wherein the transparent member comprises a transparent resin or glass.

11. The light-emitting device according to claim 10, wherein the filler comprises $TiO_2$, $SiO_2$, alumina, aluminum nitride, or mullite.

12. The light-emitting device according to claim 10, wherein the transparent resin comprises an epoxy resin, a urea resin, silicone, a modified epoxy resin, a modified silicone resin, or polyamide.

* * * * *